US009964974B2

(12) United States Patent
Lee et al.

(10) Patent No.: US 9,964,974 B2
(45) Date of Patent: May 8, 2018

(54) SEMICONDUCTOR APPARATUS

(71) Applicant: SK hynix Inc., Icheon-si, Gyeonggi-do (KR)

(72) Inventors: Hyeng Ouk Lee, Icheon-si (KR); Yong Deok Cho, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/224,867

(22) Filed: Aug. 1, 2016

(65) Prior Publication Data

US 2017/0248979 A1 Aug. 31, 2017

(30) Foreign Application Priority Data

Feb. 26, 2016 (KR) ........................ 10-2016-0023582

(51) Int. Cl.
*H03K 3/01* (2006.01)
*G05F 1/46* (2006.01)

(52) U.S. Cl.
CPC .................................... *G05F 1/468* (2013.01)

(58) Field of Classification Search
None
See application file for complete search history.

(56) References Cited

U.S. PATENT DOCUMENTS 7,449,938 B2 * 11/2008 Chu ........................ H02M 3/07 327/536
8,283,971 B2 * 10/2012 Shin ....................... G11C 5/145 327/536
2008/0018384 A1 * 1/2008 Kim ........................ G05F 1/465 327/536

FOREIGN PATENT DOCUMENTS

KR 100612949 B1 8/2006
KR 1020100114578 A 10/2010

* cited by examiner

*Primary Examiner* — Long Nguyen
(74) *Attorney, Agent, or Firm* — William Park & Associates Ltd.

(57) ABSTRACT

A semiconductor apparatus includes a detection voltage generation circuit configured to generate a first detection voltage and a second detection voltage of which voltage levels are varied according to characteristics of a PMOS transistor and an NMOS transistor in response to a detection enable signal, a code generation circuit configured to generate a detection code in response to the voltage levels of the first and second detection voltages, a reference voltage generation circuit configured to generate a reference voltage in response to the detection code, an internal voltage generation circuit configured to generate an internal voltage in response to the reference voltage, and an internal circuit configured to operate by receiving the internal voltage.

19 Claims, 5 Drawing Sheets

SEMICONDUCTOR APPARATUS

CROSS-REFERENCES TO RELATED APPLICATION

This application claims priority under 35 U.S.C. 119(a) to Korean application No. 10-2016-0023582, filed on Feb. 26, 2016, in the Korean intellectual property Office, which is incorporated by reference in its entirety as set forth in full.

BACKGROUND

1. Technical Field

The inventive concept relates to a semiconductor integrated circuit, and more particularly, to a semiconductor apparatus.

2. Related Art

Semiconductor apparatuses may be constructed of transistors and operate by receiving a voltage from the outside thereof. The semiconductor apparatuses may generate an internal voltage having a desired voltage level by receiving a voltage from outside the semiconductor and use the generated voltage inside the semiconductor.

The characteristics of a semiconductor apparatus configured of transistors may be changed according to temperature, voltage, and process changes.

The semiconductor apparatus may operate by receiving only voltages having a preset voltage level from outside the semiconductor, and voltages generated inside the semiconductor apparatus may also have preset voltage level.

Accordingly, even when characteristics of the semiconductor apparatus are changed according to temperature, voltage, and process changes, since the semiconductor apparatus only operates using a preset voltage level, it is highly likely that the semiconductor apparatus will malfunction.

SUMMARY

According to an embodiment, there is provided a semiconductor apparatus. The semiconductor apparatus may include a detection voltage generation circuit configured to generate a first detection voltage and a second detection voltage of which voltage levels are varied according to characteristics of a PMOS transistor and an NMOS transistor in response to a detection enable signal, a code generation circuit configured to generate a detection code in response to the voltage levels of the first and second detection voltages, a reference voltage generation circuit configured to generate a reference voltage in response to the detection code, an internal voltage generation circuit configured to generate an internal voltage in response to the reference voltage, and an internal circuit configured to operate by receiving the internal voltage.

According to an embodiment, there is provided a semiconductor apparatus. The semiconductor apparatus may include a detection voltage generation circuit configured to generate a first detection voltage of which a voltage level is varied according to a characteristic of a PMOS transistor and a second detection voltage of which a voltage level is varied according to a characteristic of an NMOS transistor, a code generation circuit configured to decode a P code having a code value corresponding to the voltage level of the first detection voltage and an N code having a code value corresponding to the voltage level of the second detection voltage by generating the P code and the N code and output a decoding result as a first detection code, an addition/subtraction circuit configured to generate a second detection code by performing an add operation or a subtract operation on an offset code and the first detection code, a reference voltage generation circuit configured to generate a reference voltage corresponding to a code value of the second detection code, an internal voltage generation circuit configured to generate an internal voltage corresponding to a voltage level of the reference voltage, and an internal circuit configured to operate by receiving the internal voltage.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
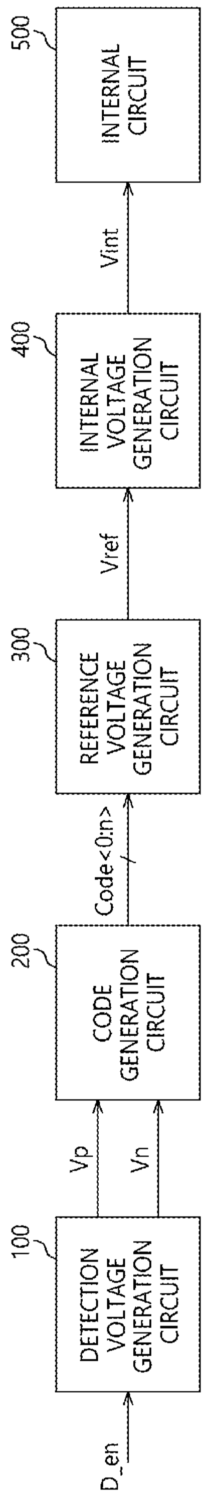
FIG. 1 is a configuration diagram illustrating a semiconductor apparatus according to an embodiment of the inventive concept.

Hereinafter, example embodiments will be described in greater detail with reference to the accompanying drawings. Example embodiments are described herein with reference to cross-sectional illustrations that are schematic illustrations of the example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

The inventive concept is described herein with reference to cross-section and/or plan illustrations that are schematic illustrations of idealized embodiments of the inventive concept. However, embodiments of the inventive concept should not be limited construed as limited to the inventive concept. Although a few embodiments of the inventive concept will be shown and described, it will be appreciated by those of ordinary skill in the art that changes may be made in these example embodiments without departing from the principles and spirit of the inventive concept.

As illustrated in FIG. 1, a semiconductor apparatus according to an embodiment may include a detection voltage generation circuit 100, a code generation circuit 200, a reference voltage generation circuit 300, an internal voltage generation circuit 400, and an internal circuit 500.

The detection voltage generation circuit 100 may generate a first detection voltage Vp and a second detection voltage Vn corresponding to a PMOS transistor and an NMOS transistor of which characteristics, such as voltage levels are varied according to at least one of a temperature, voltage, and process change in response to a detection enable signal D_en which may be enabled.

The code generation circuit 200 may generate a detection code Code<0:n> in response to each of the voltage levels of the first and second detection voltages Vp and Vn. For example, the code generation circuit 200 may generate codes corresponding to the first detection voltage Vp and the second detection voltage Vn and generate the detection code Code<0:n> by combining the generated codes.

The reference voltage generation circuit 300 may generate a reference voltage Vref in response to the detection code Code<0:n>. For example, the reference voltage generation circuit 300 may generate the reference voltage Vref having a voltage level corresponding to a code value of the detection code Code<0:n>.

The internal voltage generation circuit 400 may generate an internal voltage Vint in response to the reference voltage Vref. For example, the internal voltage generation circuit 400 may generate the internal voltage Vint having a voltage level corresponding to the voltage level of the reference voltage Vref.

The internal circuit 500 may operate by receiving the internal voltage Vint.

Figure 2:
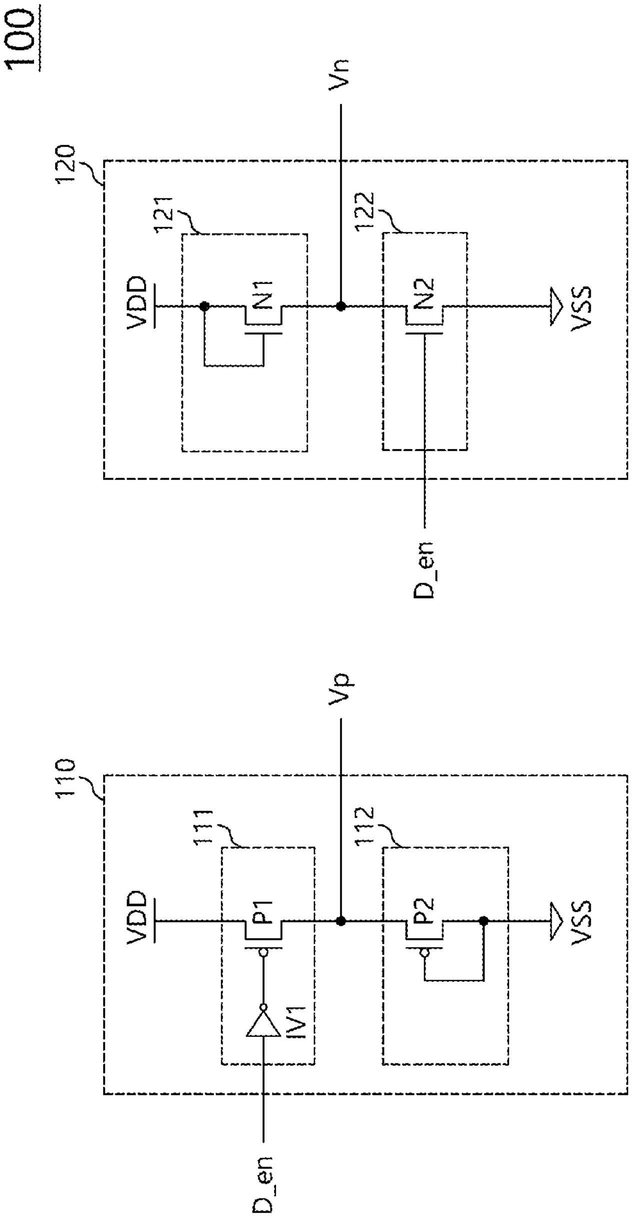
FIG. 2 is a configuration diagram illustrating a detection voltage generation circuit of FIG. 1.

As illustrated in FIG. 2, the detection voltage generation circuit 100 may include a first detection voltage generation circuit 110 and a second detection voltage generation circuit 120.

The first detection voltage generation circuit 110 may generate the first detection voltage Vp of which the voltage level is varied according to at least one of a temperature, voltage, and process change when the detection enable signal D_en is enabled.

The first detection voltage generation circuit 110 may include a first current source 111 and a first current sink 112.

The first current source 111 may output a current in response to the detection enable signal D_en. For example, the first current source 111 may output a preset amount of current to the first current sink 112 when the detection enable signal D_en is enabled.

The first current source 111 may include an inverter IV1 and a first transistor P1. The inverter IV1 may receive the detection enable signal D_en. A gate of the first transistor P1 may receive an output signal of the inverter IV1 and a source of the first transistor P1 may receive an external voltage VDD.

The first current sink 112 may allow a portion of the current output from the first current source 111 to flow to a ground terminal VSS. The first current sink 112 may vary the amount of current flowing to the ground terminal VSS according to the at least one of a temperature, voltage, and process change.

The first current sink 112 may include a second transistor P2. The first current sink 112 including the second transistor P2 may be configured in a diode form. A gate and a drain of the second transistor P2 may be coupled to the ground terminal VSS, and a source of the second transistor P2 may be coupled to a drain of the first transistor P1. The first detection voltage Vp may be output at a node where the first and second transistors P1 and P2 are coupled to each other.

The first detection voltage generation circuit 110 having the above-described configuration may be configured of only PMOS transistors, and when the detection enable signal D_en is enabled, a voltage level of the first detection voltage Vp may be determined according to an amount of current flowing out from the first current sink 112. Accordingly, the first detection voltage Vp may have a voltage level corresponding to characteristics of the PMOS transistor P2 varied according to the at least one of a temperature, voltage, and process change.

The second detection voltage generation circuit 120 may generate the second detection voltage Vn of which a voltage level is varied according to the at least one of a temperature, voltage, and process change when the detection enable signal D_en is enabled.

The second detection voltage generation circuit 120 may include a second current source 121 and a second current sink 122.

The second current source 121 may apply a current of which a current amount is varied according to the at least one of a temperature, voltage, and process change to the second current sink 122.

The second current source 121 may include a third transistor N1. The second current source 121 including the third transistor N1 may be configured in a diode form. A drain and a gate of the third transistor N1 may receive the external voltage VDD. The second current sink 122 may allow a portion of current applied from the second current source 121 to flow to the ground terminal VSS in response to the detection enable signal D_en. For example, when the detection enable signal D_en is enabled, the second current sink 122 may allow a fixed current amount of the current output from the second current source 121 to flow to the ground terminal VSS.

The second current sink 122 may include a fourth transistor N2. A gate of the fourth transistor N2 may receive the detection enable signal D_en, a drain of the fourth transistor N2 may be coupled to a source of the third transistor N1, and a source of the fourth transistor N2 may be coupled to the ground terminal Vss.

The second detection voltage generation circuit 120 having the above-described configuration may be configured of only NMOS transistors, and when the detection enable signal D_en is enabled, a voltage level of the second detection voltage Vn may be determined according to an amount of current input from the second current source 121. Accordingly, the second detection voltage Vn may have a voltage level corresponding to the characteristic of the NMOS transistor N1 varied according to the at least one of a temperature, voltage, and process change.

Figure 3:
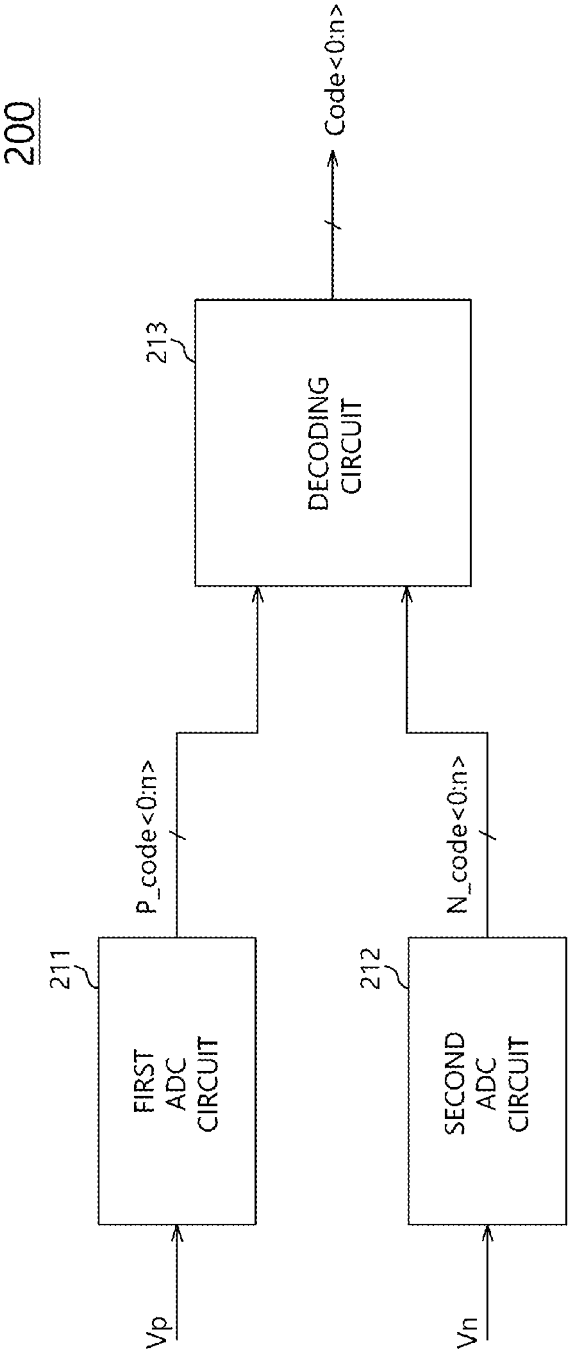
FIG. 3 is a configuration diagram illustrating a code generation circuit of FIG. 1.

As illustrated in FIG. 3, the code generation circuit 200 may include a first analog to digital conversion (ADC) circuit 211, a second ADC circuit 212, and a decoding circuit 213.

The first ADC circuit 211 may generate a P code P_code<0:n> having a code value corresponding to the voltage level of the first detection voltage Vp.

The second ADC circuit 212 may generate an N code N_code<0:n> having a code value corresponding to the voltage level of the second detection voltage Vn.

The decoding circuit 213 may generate the detection code Code<0:n> by decoding the P code P_code<0:n> and the N code N_code<0:n>.

An operation of the semiconductor apparatus having the above-described configuration according to an embodiment will be described below.

As illustrated in FIG. 2, the detection voltage generation circuit 100 may include the first detection voltage generation circuit 110 configured of only PMOS transistors and the second detection voltage generation circuit 120 configured of only NMOS transistors.

The first detection voltage generation circuit 110 may be configured of only PMOS transistors, that is, the first transistor P1 and the second transistor P2 may be only PMOS transistors. Therefore, the first detection voltage generation circuit 110 may generate the first detection voltage VP according to a characteristic of the PMOS transistor which is varied according to the at least one of a temperature, voltage, and process change.

The second detection voltage generation circuit 120 may be configured of only NMOS transistors, that is, the third transistor N1 and the fourth transistor N2. Therefore, the second detection voltage generation circuit 120 may generate the second detection voltage Vn according to characteristics of the NMOS transistor N1 which is varied according to the at least one of a temperature, voltage, and process change.

As illustrated in FIG. 3, the code generation circuit 200 may include the first ADC circuit 211, the second ADC circuit 212, and the decoding circuit 213.

The first ADC circuit 211 may generate a P code P_code<0:n> having a code value corresponding to the voltage level of the first detection voltage Vp.

The second ADC circuit 212 may generate an N code N_code<0:n> having a code value corresponding to the voltage level of the second detection voltage Vn.

The decoding circuit 213 may generate the detection code Code<0:n> by decoding the P code P_code<0:n> and the N code N_code<0:n>.

The reference voltage generation circuit 300 may generate a reference voltage Vref having a voltage level corresponding to the code value of the detection code Code<0:n>.

The internal voltage generation circuit 400 may generate an internal voltage Vint having a voltage level corresponding to the voltage level of the reference voltage Vref.

The internal circuit 500 may operate by receiving the internal voltage Vint.

The semiconductor apparatus according to an embodiment may generate variable characteristics of the PMOS transistor and the NMOS transistor according to the at least one of a temperature, voltage, and process change as a variable code, generate a reference voltage corresponding to a variable code and an internal voltage corresponding to the reference voltage, and apply the generated internal voltage to an internal circuit. Accordingly, the internal circuit may operate by receiving the internal voltage of which the voltage level is varied according to the at least one of a temperature, voltage, and process change.

Figure 4:
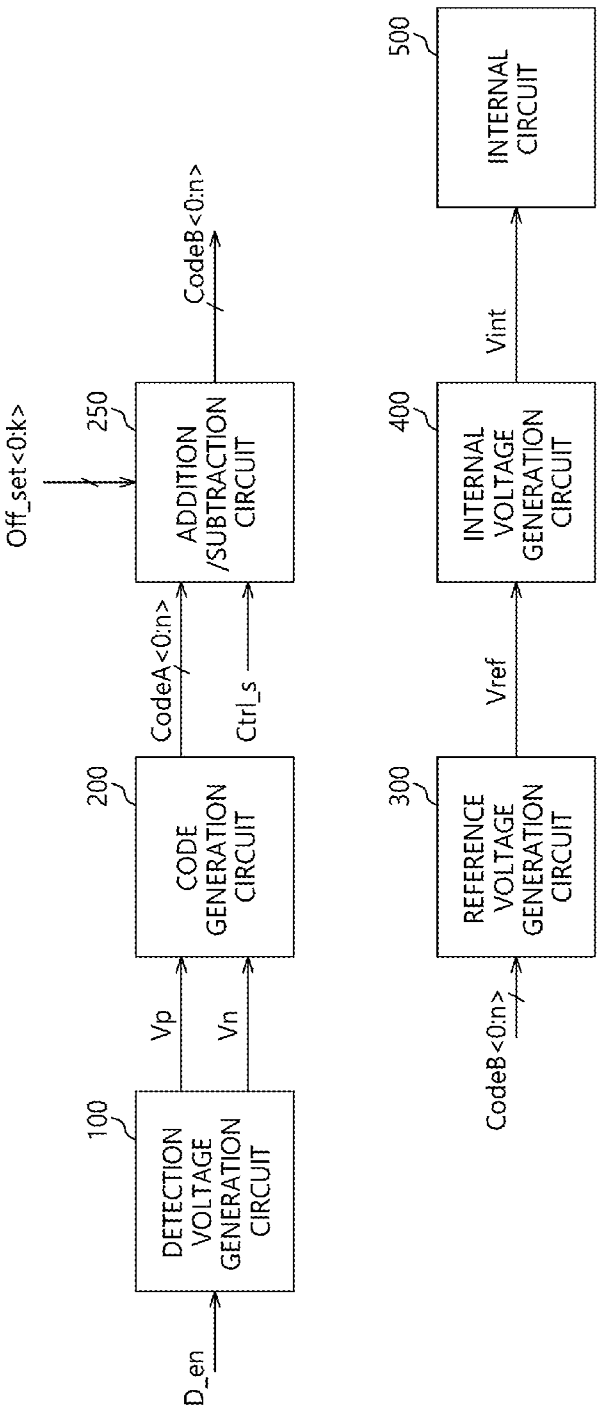
FIG. 4 is a configuration diagram illustrating a semiconductor apparatus according to an embodiment of the inventive concept.

As illustrated in FIG. 4, a semiconductor apparatus according to an embodiment may include a detection voltage generation circuit 100, a code generation circuit 200, an addition/subtraction circuit 250, a reference voltage generation circuit 300, an internal voltage generation circuit 400, and an internal circuit 500.

The detection voltage generation circuit 100 may generate a first detection voltage Vp and a second detection voltage Vn of which voltage levels are varied according to at least one of a temperature, voltage, and process change in response to a detection enable signal D_en.

The code generation circuit 200 may generate a first detection code CodeA<0:n> corresponding to voltage levels of the first and second detection voltages Vp and Vn. For example, the code generation circuit 200 may generate codes corresponding to the first detection voltage Vp and the second detection voltage Vn and generate the first detection code CodeA<0:n> by combining the generated codes.

The addition/subtraction circuit 250 may generate a second detection code CodeB<0:n> in response to a control signal Ctrl_s, the first detection code CodeA<0:n>, and an offset code Off_set<0:n>. For example, when the control signal Ctrl_s is enabled, the addition/subtraction circuit 250 may generate the second detection code CodeB<0:n> by performing a logic add operation on the first detection code CodeA<0:n> and the offset code Off_set<0:n>. When the control signal Ctrl_s is disabled, the addition/subtraction circuit 250 may generate the second detection code CodeB<0:n> by performing a logic subtract operation on the first detection code CodeA<0:n> and the offset code Off_set<0:n>.

The reference voltage generation circuit 300 may generate the reference voltage Vref in response to the second detection code CodeB<0:n>. For example, the reference voltage generation circuit 300 may generate the reference voltage Vref having a voltage level corresponding to a code value of the second detection code CodeB<0:n>.

The internal voltage generation circuit 400 may generate an internal voltage Vint in response to the reference voltage Vref. For example, the internal voltage generation circuit 400 may generate the internal voltage Vint having a voltage level corresponding to the voltage level of the reference voltage Vref.

The internal circuit 500 may operate by receiving the internal voltage Vint.

As illustrated in FIG. 2, the detection voltage generation circuit 100 may include a first detection voltage generation circuit 110 and a second detection voltage generation circuit 120.

The first detection voltage generation circuit 110 may generate the first detection voltage Vp of which the voltage level is varied according to the at least one of a temperature, voltage, and process change when the detection enable signal D_en is enabled.

The first detection voltage generation circuit 110 may include a first current source 111 and a first current sink 112.

The first current source 111 may output a current in response to the detection enable signal D_en. For example, the first current source 111 may output a preset amount of current to the first current sink 112 when the detection enable signal D_en is enabled.

The first current source 111 may include an inverter IV1 and a first transistor P1. The inverter IV1 may receive the detection enable signal D_en. A gate of the first transistor P1 may receive an output signal of the inverter IV1 and a source of the first transistor P1 may receive an external voltage VDD.

The first current sink 112 may allow a portion of the current output from the first current source 111 to flow to a ground terminal VSS. The first current sink 112 may vary the amount of current flowing to the ground terminal VSS according to the at least one of a temperature, voltage, and process change.

The first current sink 112 may include the second transistor P2. A source of the second transistor P2 may be coupled to a drain of the first transistor P1, and a gate and a drain of the second transistor P2 may be coupled to the ground terminal VSS. The first detection voltage Vp may be output at a node where the first and second transistors P1 and P2 are coupled to each other.

The first detection voltage generation circuit 110 having the above-described configuration may be configured of only PMOS transistors, and when the detection enable signal D_en is enabled, a voltage level of the first detection voltage Vp may be determined according to an amount of current flowing out from the first current sink 112. Accordingly, the first detection voltage Vp may have a voltage level varied according to characteristics of the PMOS transistor P2 the at least one temperature, voltage, and process change.

The second detection voltage generation circuit 120 may generate the second detection voltage Vn of which a voltage level is varied according to the at least one temperature, voltage, and process change when the detection enable signal D_en is enabled.

The second detection voltage generation circuit 120 may include a second current source 121 and a second current sink 122.

The second current source 121 may apply a current of which a current amount is varied according to the at least one of a temperature, voltage, and process change to the second current sink 122.

The second current source 121 may include a third transistor N1. A drain and a gate of the third transistor N1 may receive the external voltage VDD.

The second current sink 122 may allow a portion of current applied from the second current source 121 to flow to the ground terminal VSS in response to the detection enable signal D_en. For example, when the detection enable signal D_en is enabled, the second current sink 122 may allow a fixed current amount of the current output from the second current source 121 to flow to the ground terminal VSS.

The second current sink 122 may include a fourth transistor N2. A gate of the fourth transistor N2 may receive the detection enable signal D_en, a drain of the fourth transistor N2 may be coupled to a source of the third transistor N1, and a source of the fourth transistor N2 may be coupled to the ground terminal Vss.

The second detection voltage generation circuit 120 having the above-described configuration may be configured of only NMOS transistors, and when the detection enable signal D_en is enabled, a voltage level of the second detection voltage Vn may be determined according to an amount of current input from the second current source 121. Accordingly, the second detection voltage Vn may have a voltage level varied according to the characteristics of the NMOS transistor N1 including the at least one of a temperature, voltage, and process change.

As illustrated in FIG. 3, the code generation circuit 200 may include a first ADC circuit 211, a second ADC circuit 212, and a decoding circuit 213.

The first ADC circuit 211 may decode a P code P_code<0:n> having a code value corresponding to the voltage level of the first detection voltage Vp by generating the P code.

The second ADC circuit 212 may decode an N code N_code<0:n> having a code value corresponding to the voltage level of the second detection voltage Vn by generating the N code.

The decoding circuit 213 may generate the detection code Code<0:n> as the first detection code Code<0:n> or CodeA<0:n> by decoding the P code P_code<0:n> and the N code N_code<0:n>.

An operation of the semiconductor apparatus having the above-described configuration according to an embodiment will be described below.

As illustrated in FIG. 2, the detection voltage generation circuit 100 may include the first detection voltage generation circuit 110 configured of only PMOS transistors and the second detection voltage generation circuit 120 configured of only NMOS transistors.

The first detection voltage generation circuit 110 may be configured of only PMOS transistors, that is, the first transistor P1 and the second transistor P2. Therefore, the first detection voltage generation circuit 110 may generate the first detection voltage VP according to a characteristic of the PMOS transistor which is varied according to the at least one of a temperature, voltage, and process change.

The second detection voltage generation circuit 120 may be configured of only NMOS transistors, that is, the third transistor N1 and the fourth transistor N2. Therefore, the second detection voltage generation circuit 120 may generate the second detection voltage Vn according to characteristics of the NMOS transistor N1 which is varied according to the at least one of a temperature, voltage, and process change.

As illustrated in FIG. 3, the code generation circuit 200 may include the first ADC circuit 211, the second ADC circuit 212, and the decoding circuit 213.

The first ADC circuit 211 may generate the P code P_code<0:n> having the code value corresponding to the voltage level of the first detection voltage Vp.

The second ADC circuit 212 may generate the N code N_code<0:n> having the code value corresponding to the voltage level of the second detection voltage Vn.

The decoding circuit 213 may generate the first detection code CodeA<0:n> by decoding the P code P_code<0:n> and the N code N_code<0:n>.

The addition/subtraction circuit 250 may perform an add operation or a subtract operation on the first detection code CodeA<0:n> and the offset code Off_set<0:n> in response to the control signal Ctrl_s and output the add-operated value or a subtract-operated value as the second detection code CodeB<0:n>.

The reference voltage generation circuit 300 may generate the reference voltage Vref having a voltage level corresponding to the code value of the second detection code CodeB<0:n>.

The internal voltage generation circuit 400 may generate the internal voltage Vint having a voltage level corresponding to the voltage level of the reference voltage Vref.

The internal circuit 500 may operate by receiving the internal voltage Vint.

The semiconductor apparatus according to an embodiment may generate variable characteristics of the PMOS transistor and the NMOS transistor according to the at least one of a temperature, voltage, and process changes as the first detection code, generate the second detection code by performing an add operation or a subtract operation on the generated first detection code and the offset code, generate the reference voltage corresponding to the second detection code and the internal voltage corresponding to the reference voltage, and apply the generated internal voltage to the internal circuit. Accordingly, the internal circuit may operate by receiving the internal voltage of which the voltage level is varied according to the at least one of a temperature, voltage, and process change. The voltage level of the internal voltage may be controlled using the offset code again.

The above embodiment of the present disclosure is illustrative and not limitative. Various alternatives and equivalents are possible. The disclosure is not limited by the embodiment described herein. Nor is the disclosure limited to any specific type of semiconductor device. Other additions, subtractions, or modifications are obvious in view of the present disclosure and are intended to fall within the scope of the appended claims.

Figure 5:
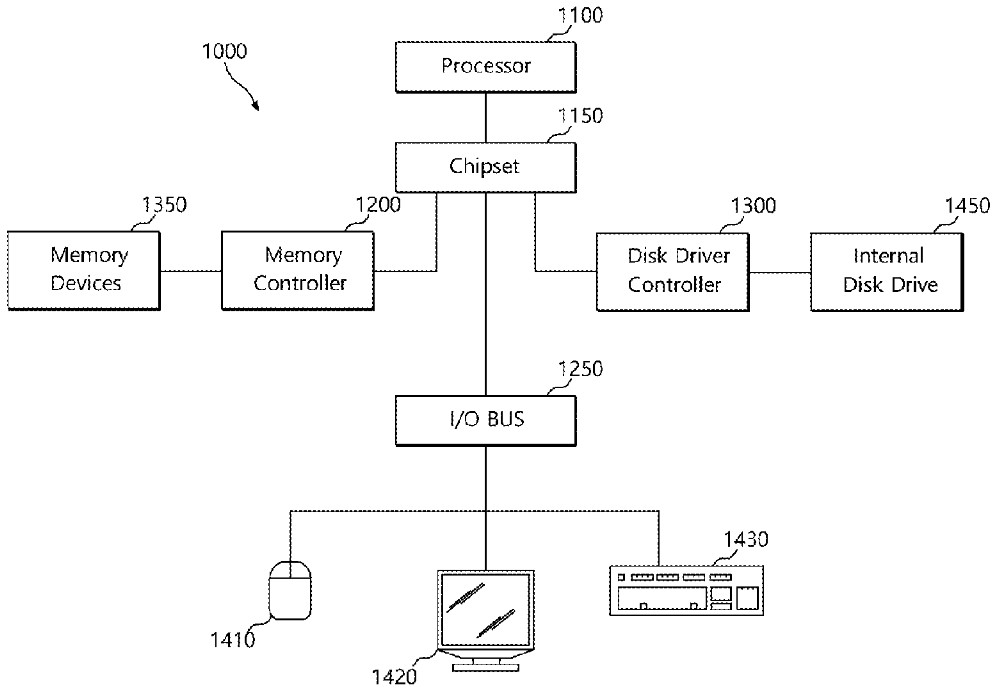
FIG. 5 illustrates a block diagram of an example representation of a system employing a semiconductor device in accordance with the various embodiments discussed above with relation to FIGS. 1-4.

The semiconductor devices and/or a power driving circuits discussed above (see FIGS. 1-4) are particularly useful in the design of memory devices, processors, and computer systems. For example, referring to FIG. 5, a block diagram of a system employing a semiconductor device and/or a power driving circuit in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor apparatus as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a system 1000 employing a semiconductor device as discussed above with relation to FIGS. 1-4. In alternate embodiments, such as, for example but not limited to, cellular phones or digital cameras, the components may differ from the embodiments illustrated in FIG. 5.

What is claimed is:

1. A semiconductor apparatus comprising:

a detection voltage generation circuit configured to generate a first detection voltage and a second detection voltage of which voltage levels are varied according to characteristics of a PMOS transistor and an NMOS transistor of the detection voltage generation circuit in response to a detection enable signal;

a code generation circuit configured to generate a detection code in response to the voltage levels of the first and second detection voltages;

a reference voltage generation circuit configured to generate a reference voltage in response to the detection code;

an internal voltage generation circuit configured to generate an internal voltage in response to the reference voltage; and an internal circuit configured to operate by receiving the internal voltage, wherein a gate of the PMOS transistor is coupled to a drain of the PMOS transistor, and a gate of the NMOS transistor is coupled to a drain of the NMOS transistor.

2. The semiconductor apparatus of claim 1, wherein the detection voltage generation circuit is configured to generate the first detection voltage and the second detection voltage corresponding to the NMOS transistor and the PMOS transistor having characteristics which are varied according to temperature, voltage, and process change when the detection enable signal is enabled.

3. The semiconductor apparatus of claim 2, wherein the detection voltage generation circuit includes:

a first detection voltage generation circuit configured with the PMOS transistor and configured to generate the first detection voltage when the detection enable signal is enabled; and a second detection voltage generation circuit configured with the NMOS transistor and configured to generate the second detection voltage when the detection enable signal is enabled.

4. The semiconductor apparatus of claim 3, wherein the first detection voltage generation circuit includes:

a current source configured to output a current when the detection enable signal is enabled; and a current sink configured in a diode form and configured to allow a portion of the current output from the current source to flow to a ground terminal, wherein the current source and the current sink are configured of PMOS transistors.

5. The semiconductor apparatus of claim 4, wherein the current sink varies the amount of current flowing to the ground terminal according to at least one of temperature, voltage, and a process change.

6. The semiconductor apparatus of claim 3, wherein the second detection voltage generation circuit includes:

a current source configured in a diode form and configured to output a current; and a current sink configured to allow a fixed current amount of the current output from the current source to flow to a ground terminal when the detection enable signal is enabled, wherein the current source and the current sink are configured of NMOS transistors.

7. The semiconductor apparatus of claim 6, wherein the current source applies a current having a current amount varied according to at least one of a temperature, voltage, and a process change to the current sink.

8. The semiconductor apparatus of claim 3, wherein the first detection voltage generation circuit comprises transistors of only the PMOS type, and the second detection voltage generation circuit comprises transistors of only the NMOS type.

9. The semiconductor apparatus of claim 1, wherein the code generation circuit includes:

a first analog to digital conversion (ADC) circuit configured to generate a P code having a code value corresponding to the voltage level of the first detection voltage;

a second ADC circuit configured to generate an N code having a code value corresponding to the voltage level of the second detection voltage; and a decoding circuit configured to generate the detection code by decoding the P code and the N code.

10. The semiconductor apparatus of claim 1, wherein the reference voltage generation circuit is configured to generate the reference voltage having a voltage level corresponding to a code value of the detection code, and the internal voltage generation circuit is configured to generate the internal voltage having a voltage level corresponding to the voltage level of the reference voltage.

11. A semiconductor apparatus comprising:

a detection voltage generation circuit configured to generate a first detection voltage of which a voltage level is varied according to a characteristic of a PMOS transistor of the detection voltage generation circuit and a second detection voltage of which a voltage level is varied according to a characteristic of an NMOS transistor of the detection voltage generation circuit;

a code generation circuit configured to decode a P code having a code value corresponding to the voltage level of the first detection voltage and an N code having a code value corresponding to the voltage level of the second detection voltage by generating the P code and the N code and output a decoding result as a first detection code;

an addition/subtraction circuit configured to generate a second detection code by performing an add operation or a subtract operation on an offset code and the first detection code;

a reference voltage generation circuit configured to generate a reference voltage corresponding to a code value of the second detection code;

an internal voltage generation circuit configured to generate an internal voltage corresponding to a voltage level of the reference voltage; and an internal circuit configured to operate by receiving the internal voltage.

12. The semiconductor apparatus of claim 11, wherein the detection voltage generation circuit includes:

a first detection voltage generation circuit configured of the PMOS transistor and configured to generate the first detection voltage; and a second detection voltage generation circuit configured of the NMOS transistor and configured to generate the second detection voltage.

13. The semiconductor apparatus of claim 12, wherein the first detection voltage generation circuit includes:

a current source configured to output a current when a detection enable signal is enabled; and a current sink configured in a diode form and configured to allow a portion of the current output from the current source to flow to a ground terminal, wherein the current source and the current sink are configured of PMOS transistors.

14. The semiconductor apparatus of claim 13, wherein the current sink varies the amount of current flowing to the ground terminal according to at least one of temperature, voltage, and a process change.

15. The semiconductor apparatus of claim 12, wherein the second detection voltage generation circuit includes:

a current source configured in a diode form and configured to output a current; and a current sink configured to allow a fixed current amount of the current output from the current source to flow to a ground terminal when a detection enable signal is enabled, wherein the current source and the current sink are configured of NMOS transistors.

16. The semiconductor apparatus of claim 15, wherein the current source applies a current having a current amount varied according to at least one of temperature, voltage, and a process change to the current sink.

17. The semiconductor apparatus of claim 12, wherein the first detection voltage generation circuit comprises transistors of only the PMOS type, and the second detection voltage generation circuit comprises transistors of only the NMOS type.

18. The semiconductor apparatus of claim 11, wherein the code generation circuit includes:

a first analog to digital conversion (ADC) circuit configured to generate the P code having a code value corresponding to the voltage level of the first detection voltage;

a second ADC circuit configured to generate the N code having a code value corresponding to the voltage level of the second detection voltage; and a decoding circuit configured to decode the P code and the N code and output a decoding result as the first detection code.

19. The semiconductor apparatus of claim 11, wherein the addition/subtraction circuit is configured to generate the second detection code by performing an add operation on the first detection code and the offset code when a control signal is enabled, or to generate the second detection code by performing a subtract operation on the first detection code and the offset code when the control signal is disabled.

* * * * *